(12) United States Patent
Kim

(10) Patent No.: US 7,439,590 B2  
(45) Date of Patent: Oct. 21, 2008

(54) SEMICONDUCTOR DEVICE

(75) Inventor: Dong Hoon Kim, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 76 days.

(21) Appl. No.: 11/481,200

(22) Filed: Jul. 3, 2006

(65) Prior Publication Data

US 2007/0152278 A1    Jul. 5, 2007

(30) Foreign Application Priority Data

Dec. 30, 2005    (KR) .................. 10-2005-0134864

(51) Int. Cl.  
*H01L 23/62* (2006.01)
(52) U.S. Cl. ............... 257/356; 257/357; 257/367; 257/371; 257/E27.046
(58) Field of Classification Search ........... 257/356, 257/E27.046  
See application file for complete search history.

(56) References Cited

U.S. PATENT DOCUMENTS 5,955,764 A * 9/1999 Katsube ............... 257/355  
6,410,964 B1   6/2002 Shida  
6,828,604 B2  12/2004 Inoue

FOREIGN PATENT DOCUMENTS

KR    10-2002-0032115 A    5/2002  
KR       1020040054093 A    6/2004

* cited by examiner

*Primary Examiner*—Tu-Tu V Ho  
(74) *Attorney, Agent, or Firm*—Townsend and Townsend and Crew LLP

(57) ABSTRACT

A semiconductor device features connecting gate patterns of all transistors to a N+ or +P junction by the first connected wiring layer to prevent degradation of characteristics of the semiconductor device which results from plasma damages during a process. In order to connect a junction to a gate layer weak to plasma damages, the gate layer is connected to the N+ or P+ junction when a first wiring layer after a transistor is formed. As a result, when the gate layer is charged up by plasma damages, the gate layer is discharged by the junction or provided to receive (−) ions or electrons so that a gate oxide is not affected by plasma damages.

15 Claims, 6 Drawing Sheets

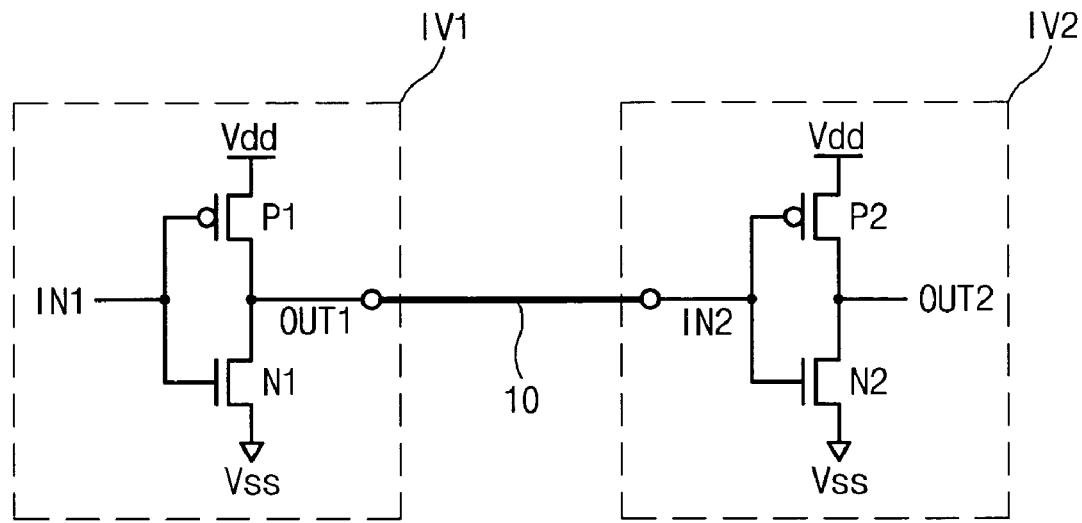
Fig.3a
<Prior Art>
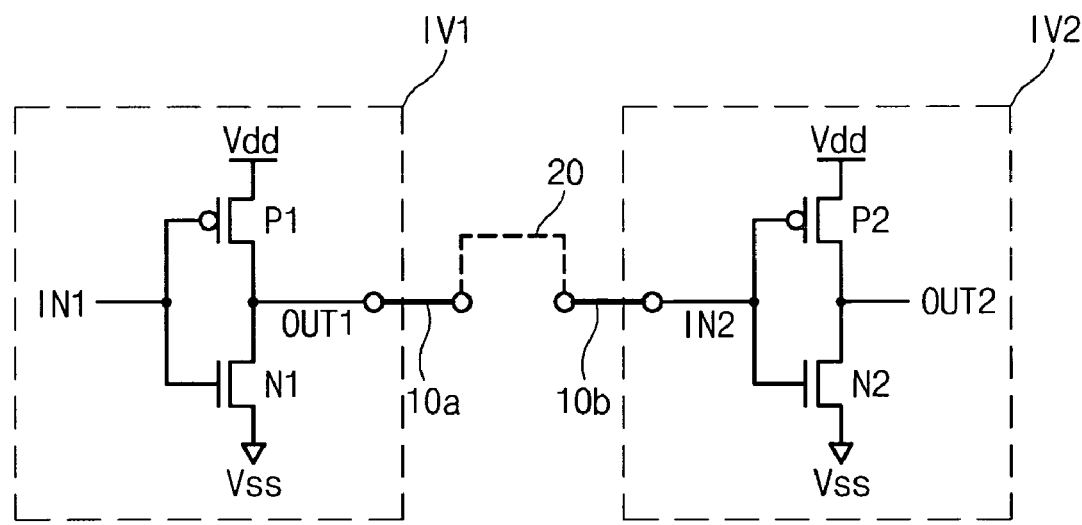

US 7,439,590 B2

SEMICONDUCTOR DEVICE

CROSS-REFERENCES TO RELATED APPLICATIONS

The present application claims priority to Korean patent application number 10-2005-0134864, filed on Dec. 30, 2005, which is incorporated by reference in its entirety.

BACKGROUND OF THE INVENTION

The present invention relates to a semiconductor device, and more specifically, to a technology of connecting gates to an N+ or P+ junction by the first connected wiring layer to prevent plasma damages during a plasma process.

In the manufacturing of general silicon semiconductors, a process for depositing or etching a thin film with plasma gas results in plasma damages which affect characteristics of unit elements on a wafer.

FIGS. 1a and 1b are diagrams illustrating plasma damages in a conventional semiconductor device.

A process for depositing a thin film which has been widely used in the semiconductor manufacturing process includes precipitating reactors on a wafer with an ionized plasma gas to form a new film. Also, a dry etching process for forming a desired pattern includes etching a specific material on a wafer with a plasma gas.

The plasma ion gas used in the above processes charges up conductive layer patterns on the wafer into positive ions. Since the plasma gas has positive (+) property, positive charges are continuously accumulated in a conductive layer covered with an insulating film during the process to attract negative particles.

A gate pattern 1 affects the characteristics of an insulating film less since the gate pattern 1 is covered with a thick insulating layer around a gate oxide 2. However, the gate oxide 2 having a thin thickness is formed close to a substrate which is a conductive layer.

When the gate pattern 1 is positively charged up, negative particles which are mostly electrons are attracted. These negative particles are trapped in the gate oxide 2 or flown into the gate pattern 1 through the gate oxide 2. Also, a discharge phenomenon occurs through the gate oxide 2 toward the substrate from the charged-up gate pattern 1.

The discharge phenomenon damages the gate oxide 2 to cause change in the characteristics of the semiconductor device, which is called plasma damages. As a result, the plasma damages generated during the manufacturing of semiconductor devices may change the device and design characteristics.

FIG. 2 is a graph illustrating threshold voltage increase of a NMOS transistor resulting from plasma damages in a conventional semiconductor device.

Referring to FIG. 2, (B) represents data measured after a first wiring layer is formed, and (C) represents data measured after a second wiring layer is formed. (D) represents data measured after a first passivation material is deposited and patterned, and (E) represents data measured after a second passivation material is deposited and patterned.

When plasma damages are generated as shown in FIGS. 1a and 1b, changes in the device characteristics, such as shifting of a threshold voltage of a transistor, causes changes in the design characteristics. However, the plasma damages are shown in each lot and in each wafer with different tendencies. As a result, it is difficult to control characteristics of the device.

FIGS. 3a and 3b are circuit diagrams illustrating a CMOS inverter in a conventional semiconductor device. Referring to FIGS. 3a and 3b, the CMOS inverter of the conventional semiconductor device includes a plurality of inverters IV1 and IV2.

The inverter IV1 includes a PMOS transistor P1 and a NMOS transistor N1 which are connected serially between a power voltage VDD terminal and a ground voltage VSS terminal. The PMOS transistor P1 and the NMOS transistor N1 receive an input signal IN1 through a common gate and output an output signal OUT1 through a common drain.

The inverter IV2 includes a PMOS transistor P2 and a NMOS transistor N2 which are connected serially between the power voltage VDD terminal and the ground voltage VSS terminal. The PMOS transistor P2 and the NMOS transistor N2 receive an input signal IN2 through a common and output an output signal OUT2 through a common drain.

The inverters IV1 and IV2 are interconnected through a first wring layer 10 in FIG. 3a. As shown in FIG. 3b, the inverters IV1 and IV2 are interconnected through first wiring layers 10a, 10b and through a second wiring layer 20 connected between the first wiring layers 10a and 10b.

FIG. 4 is a layout diagram illustrating the CMOS inverter of FIG. 3. Referring to FIG. 4, the PMOS transistor P2 of the inverter IV2 is formed in an N-well 30 and the NMOS transistor N2 is formed in a P-well 40. A gate of each transistor is connected to the first wiring layer 10b through a contact node CN1.

When the inverters IV1 and IV2 are interconnected through the first wiring layer 10 as shown in FIG. 3a, a gate layer of the inverter IV2 is connected to a junction for preventing plasma damages during the process after the first wiring layer 10 is formed. However, when the second wiring layer 20 is formed as shown in FIG. 3b, the second inverter IV2 is affected by plasma damages generated from a process for depositing the first wiring layers 10a, 10b and an interlayer insulating film.

SUMMARY OF THE INVENTION

Various embodiments of the present invention are directed to connecting an N+ or P+ junction (or conductive junction unit) to a gate input node of a transistor when a metal layer is formed to prevent degradation of characteristics of a semiconductor device resulting from plasma damages generated during a plasma process.

According to an embodiment of the present invention, a semiconductor device comprises of; a transistor with a gate oxide formed in a predetermined region of a semiconductor device; a first wiring layer connected to a gate of the transistor; and a doped junction unit connected between the gate of the transistor and the first wiring layer. The transistor is provided to connect the gate to the junction region in formation of the first wiring layer.

According to another embodiment of the present invention, a semiconductor device comprises a first transistor formed in a N-well region of a semiconductor substrate and including a gate oxide layer, a second transistor formed in a P-well region of the semiconductor substrate and including a gate oxide layer, a first wring layer provided to connect a first gate of the first transistor to a second gate of the second transistor, and a junction unit connected to the first gate and the second gate in formation of the first wiring layer.

According to another embodiment, a semiconductor device comprises a first transistor formed in an N-well region of a semiconductor substrate. The first transistor includes a first gate oxide layer over the substrate and a first gate over the first gate oxide layer. A second transistor is formed in a P-well region of the semiconductor substrate. The second transistor includes a second gate oxide layer over the substrate and a second gate over the second gate oxide layer. A first wiring layer is provided to connect the first gate of the first transistor to the second gate of the second transistor. A first junction unit is connected to the first gate. The first junction unit is configured to discharge charges accumulated on the first gate to prevent the first gate oxide layer from being damaged.

In yet another embodiment, the semiconductor device further includes a second junction unit connected to the second gate. The second junction unit is configured to discharge charges accumulated on the second gate to prevent the second gate oxide layer from being damaged. The first and second junction units are first and second diodes, respectively. An anode of the first diode is connected to the first transistor, and a cathode of the second diode is connected to the second transistor. The first and second transistors are PMOS and NMOS transistors, respectively.

BRIEF DESCRIPTION OF THE DRAWINGS

FIGS. 3a and 3b are circuit diagrams illustrating a CMOS inverter in a conventional semiconductor device.

DESCRIPTION OF SPECIFIC EMBODIMENTS

Figure 1A:
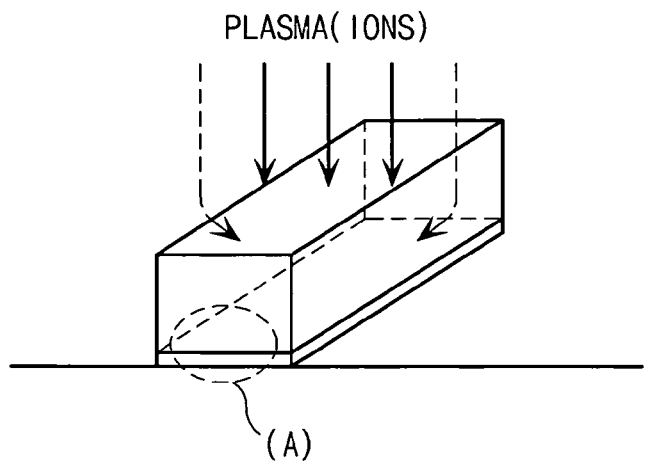
FIGS. 1a and 1b are diagrams illustrating plasma damages in a conventional semiconductor device.
Figure 1B:
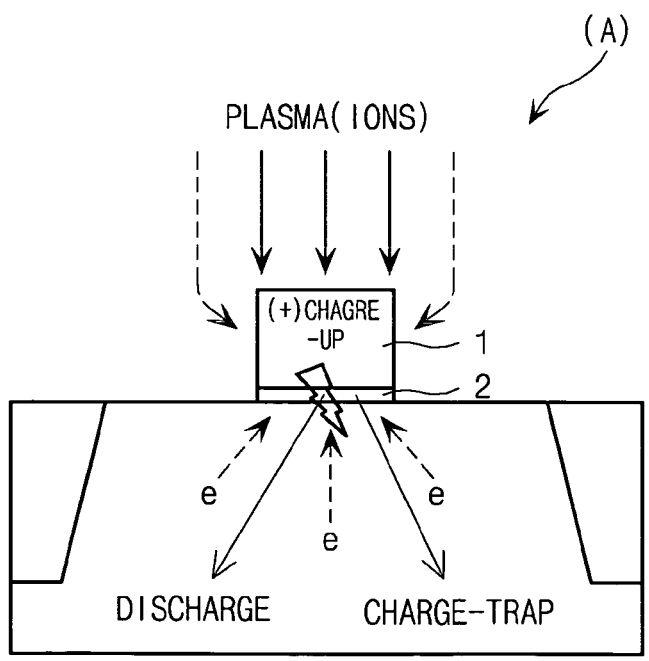
Figure 2:
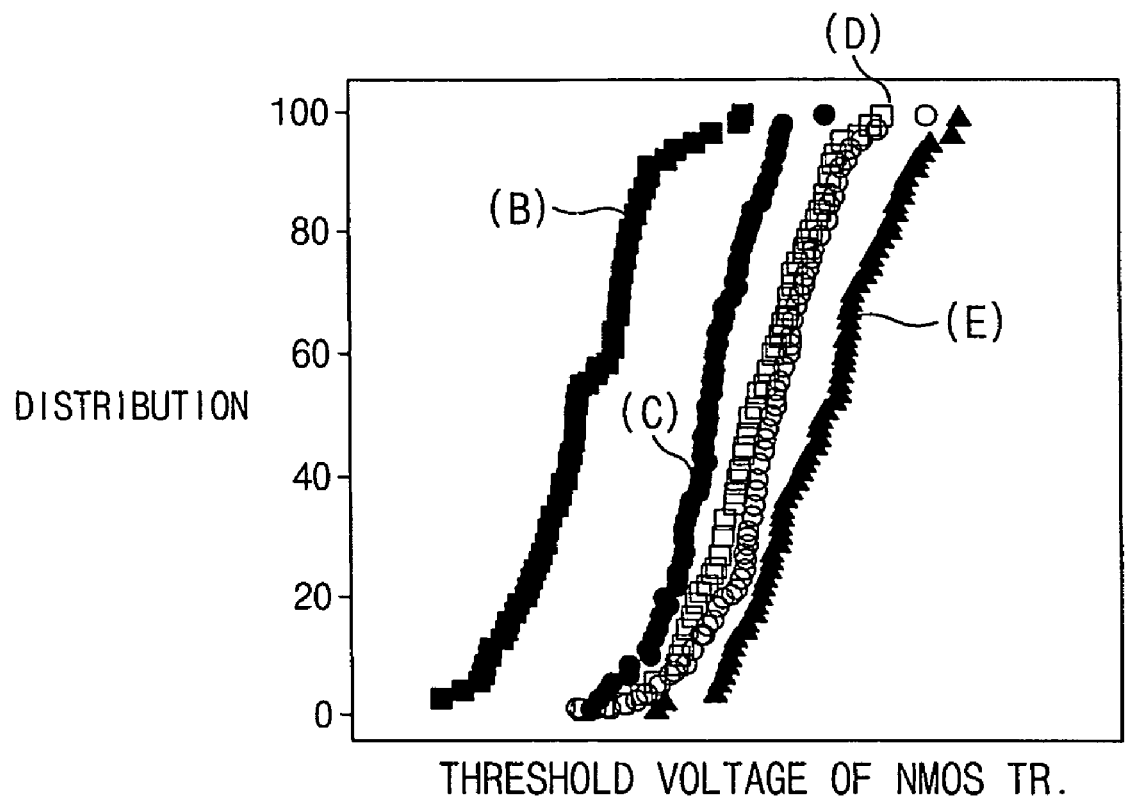
FIG. 2 is a graph illustrating threshold voltage increase resulting from plasma damages in a conventional semiconductor device.
Figure 4:
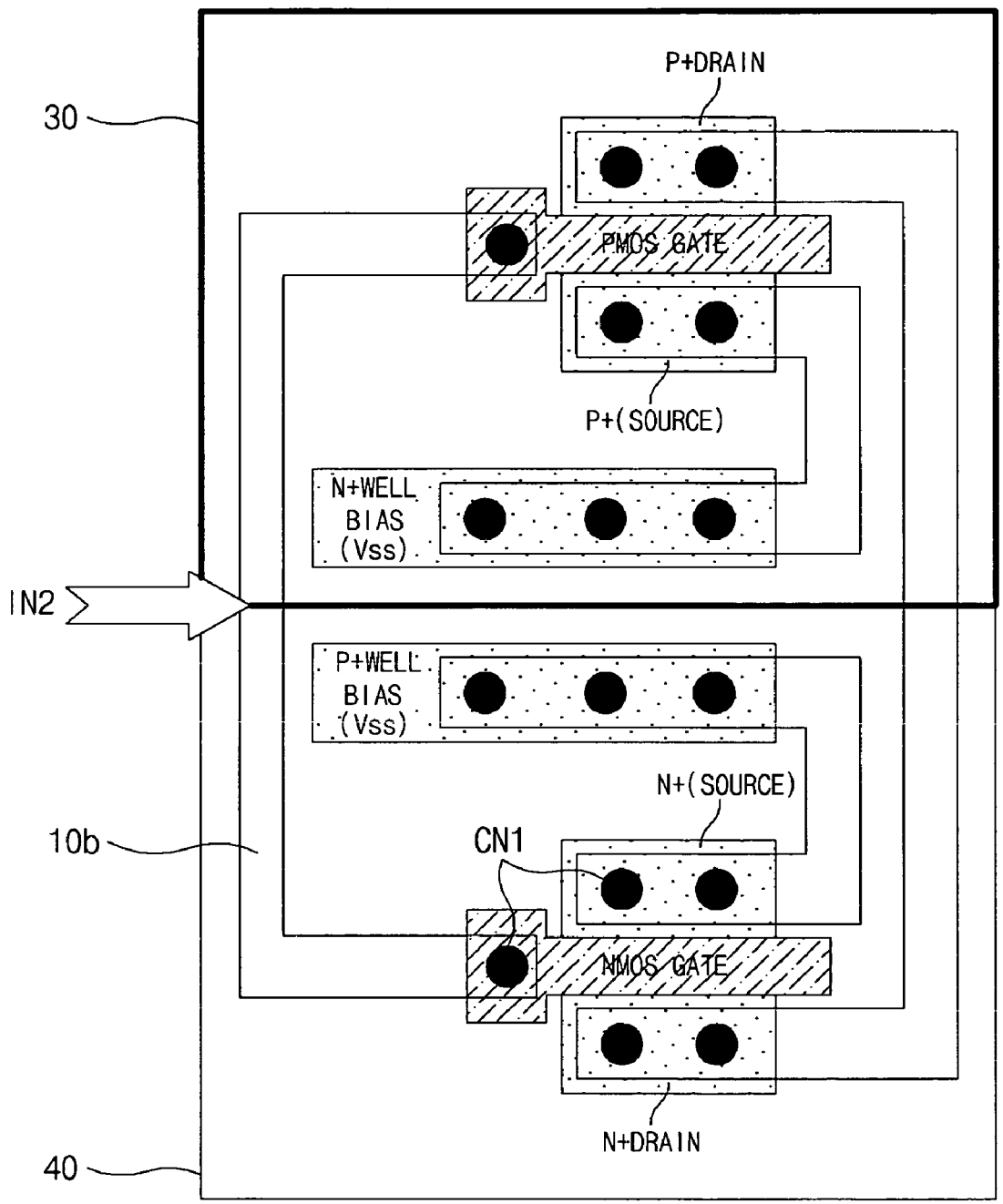
FIG. 4 is a layout diagram illustrating the CMOS inverter of FIG. 3.
Figure 5:
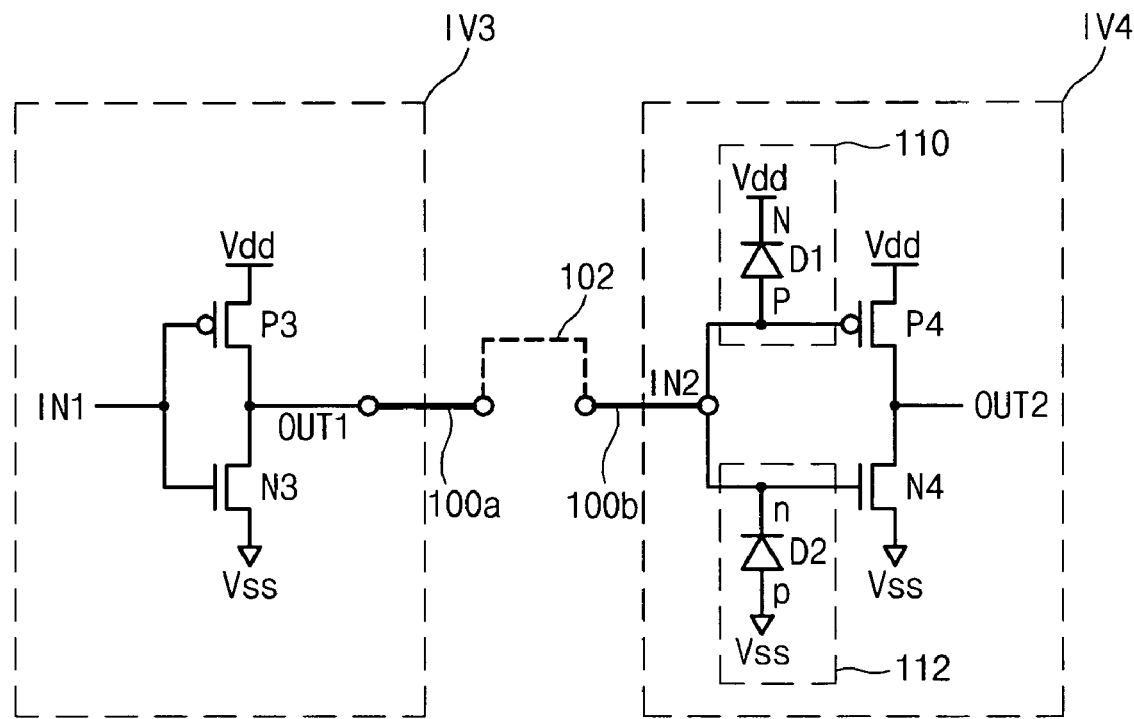
FIG. 5 is a circuit diagram illustrating a CMOS inverter of a semiconductor device according to an embodiment of the present invention.

FIG. 5 is a circuit diagram illustrating a CMOS inverter of a semiconductor device according to an embodiment of the present invention.

The CMOS inverter of FIG. 5 includes a plurality of serially connected inverters IV3 and IV4.

The inverter IV3 includes a PMOS transistor P3 and a NMOS transistor N3 which are connected by their drains. The sources of the transistors P3 and N3 are connected to the power voltage VDD terminal and the ground voltage VSS terminal, respectively. The PMOS transistor P4 and the NMOS transistor N4 receive an input signal IN1 through a common gate and output an output signal OUT1 through a common drain.

The inverter IV4 includes the PMOS transistor P4, the NMOS transistor N4, and junction units 110 and 112 (or conductive junction units). The drains of the PMOS transistor P4 and the NMOS transistor N4 share the same node, and the sources of the transistors P4 and N4 are connected to the power voltage VDD terminal and the ground voltage VSS terminal, respectively. The PMOS transistor P4 and the NMOS transistor N4 receive an input signal IN2 through a common gate and output an output signal OUT2 through a common drain.

The inverters IV3 and IV4 are connected through first wiring layers 100a, 100b and a second wiring layer 102 connected between the first wiring layers 100a, 100b.

The junction unit 110 includes a diode D1 connected between the gate of the PMOS transistor P4 and the power voltage VDD terminal. The junction unit 112 includes a diode D2 connected between the ground voltage terminal and the gate of the NMOS transistor N4.

In this embodiment, since a gate layer of the inverter IV4 is weak to plasma damages, the diodes D1 and D2 are formed for connecting the gate layer of the inverter IV4 to the junction. That is, in order to prevent plasma damage, the anode or cathode of the diodes is connected to the first wiring layers 100a and 100b after the transistor is formed. As a result, when the gate layer is charged up by plasma damages, the charges accumulated on the gate layer are discharged through the diode (or the gate layer receives negative particles or electrons) so that plasma damages can be avoided on the gate oxide.

Figure 6:
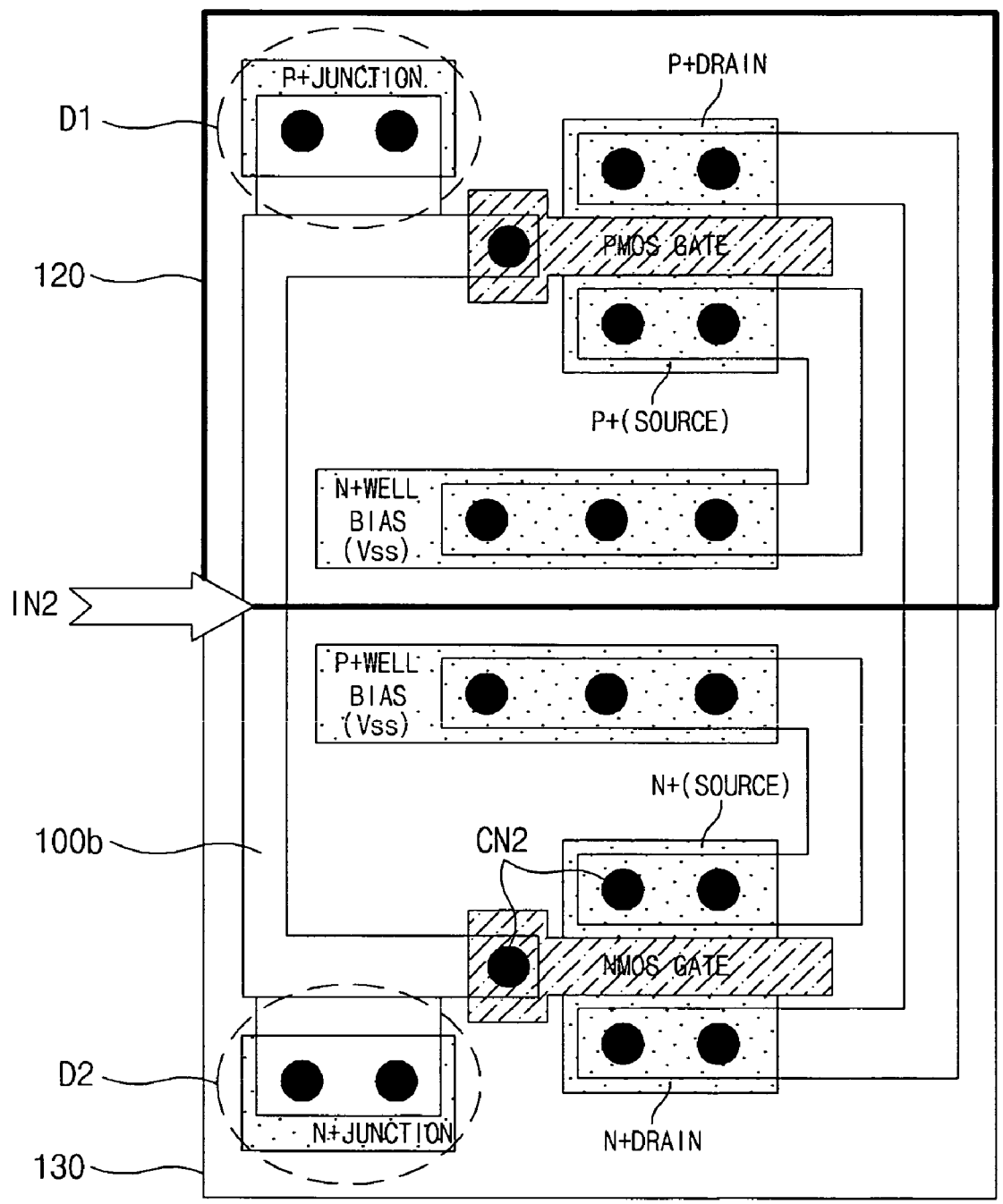
FIG. 6 is a layout diagram illustrating a CMOS inverter according to an embodiment of the present invention.

FIG. 6 is a layout diagram illustrating a CMOS inverter according to an embodiment of the present invention.

Referring to FIG. 6, the PMOS transistor P4 of the inverter IV4 is formed in an N-well 120 and the NMOS transistor is formed in a P-well 130 so that the common gate of the PMOS transistor P4 and the NMOS transistor N4 is connected to the first wiring layer 100b. Here, a gate of each transistor is connected to the first wiring layer 10b through a contact node CN2.

The diode D1 for forming the P+ junction (e.g., junction unit 110) is connected between a node for receiving the input signal IN2 and the gate of the PMOS transistor P4. The diode D2 for forming the N+ junction (e.g., junction unit 112) is connected between a node for receiving the input signal IN2 and the gate of the NMOS transistor N4.

The diodes D1 and D2 are connected to the first wiring layer 100b for receiving the input signal IN2. The diodes D1 and D2 are formed in a space of the N-well 120 and the P-well 130 to minimize increase of the chip size resulting from junction addition.

The diodes D1 and D2 includes a N+ junction and a P+ junction at the most adjacent location in the same direction as that connected to the first wiring layer 100b to prevent formation of junctions in a path after the first wiring layer 100b is connected to the gate. That is, before a plasma ion effect applied from the first wiring layer 100b is transmitted into the gate of the PMOS transistor P4 and the NMOS transistor N4, the gate is connected to the anode and the cathode of the diodes D1 and D2.

Although a CMOS inverter of a semiconductor device is exemplified in this embodiment of the present invention, the present invention may be applied to all semiconductor circuits using a gate oxide. In the design of semiconductor devices, all gate patterns are connected to the N+ or P+ junction when the first wiring layers 100a and 100b to prevent change of the device and design characteristics by plasma damages.

As described above, a semiconductor device according to an embodiment of the present invention prevents degradation of characteristics of the semiconductor device resulting from plasma damages to secure operating characteristics and yield of the semiconductor device.

The foregoing description of various embodiments of the invention has been presented for the purpose of illustration and description. It is not intended to be exhaustive or limited to the precise form disclosed. Modifications and variations are possible in light of the above teachings or acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A semiconductor device comprising:
   a plurality of transistors, each including a gate oxide over the semiconductor substrate and a gate over the gate oxide;
   a plurality of conductive junction units, each conductive junction unit connected between the gate of each transistor and a first wiring layer, each conductive junction unit being configured to discharge charges accumulated on the gate to prevent the gate oxide from being damaged; and
   the first wiring layer coupled to each gate of the plurality of transistors through each conductive junction unit.

2. The semiconductor device according to claim 1, wherein the transistor is a PMOS transistor.

3. The semiconductor device according to claim 2, wherein the conductive junction unit includes a first diode connected between the transistor and a power voltage terminal.

4. The semiconductor device according to claim 1, wherein the transistor is an NMOS transistor.

5. The semiconductor device according to claim 4, wherein the junction unit includes a second diode connected between a ground voltage terminal and the transistor.

6. The semiconductor device according to claim 1, wherein the device includes a CMOS inverter.

7. A semiconductor device comprising:
   a first transistor formed in an N-well region of a semiconductor substrate, the first transistor including a first gate oxide layer over the substrate and a first gate over the first gate oxide layer;
   a second transistor formed in a P-well region of the semiconductor substrate, the second transistor including a second gate oxide layer over the substrate and a second gate over the second gate oxide layer;
   a first junction unit connected to the first gate, the first junction unit being configured to discharge charges accumulated on the first gate to prevent the first gate oxide layer from being damaged;
   a second junction unit connected to the second gate, the second junction unit being configured to discharge charges accumulated on the second gate to prevent the second gate oxide layer from being damaged; and
   a first wiring layer provided to couple the first gate of the first transistor to the second gate of the second transistor through the first junction unit and the second junction unit.

8. The semiconductor device according to claim 7, wherein the first transistor is a PMOS transistor.

9. The semiconductor device according to claim 8, wherein the junction unit includes a P+ junction connected to the first gate of the first transistor in the N-well region.

10. The semiconductor device according to claim 7, wherein the second transistor is an NMOS transistor.

11. The semiconductor device according to claim 10, wherein the junction unit includes an N+ junction connected to the second gate of the second transistor in the P-well region.

12. The semiconductor device according to claim 7, wherein the junction unit is formed in the same direction as that of the first wiring layer so that the junction unit is formed in a location adjacent to the first gate and the second gate.

13. The semiconductor device of claim 7, wherein the first junction unit includes a diode.

14. The semiconductor device of claim 7, wherein the first and second junction units are first and second diodes, respectively.

15. The semiconductor device of claim 14, wherein an anode of the first diode is connected to the first transistor, and a cathode of the second diode is connected to the second transistor, the first and second transistors being PMOS and NMOS transistors, respectively.

* * * * *